(12) United States Patent
Bank et al.

(10) Patent No.: US 9,685,704 B2
(45) Date of Patent: Jun. 20, 2017

(54) SURFACE ANTENNA WITH A SINGLE RADIATION ELEMENT

(71) Applicants: Michael Bank, Jerusalem (IL); Motti Haridim, Givat Zeev (IL)

(72) Inventors: Michael Bank, Jerusalem (IL); Motti Haridim, Givat Zeev (IL)

(*) Notice: Subject to any disclaimer, the term of this patent is extended or adjusted under 35 U.S.C. 154(b) by 55 days.

(21) Appl. No.: 14/372,167

(22) PCT Filed: Jan. 17, 2013

(86) PCT No.: PCT/IL2013/050051
§ 371 (c)(1),
(2) Date: Jul. 14, 2014

(87) PCT Pub. No.: WO2013/108256
PCT Pub. Date: Jul. 25, 2013

(65) Prior Publication Data
US 2015/0002362 A1    Jan. 1, 2015

Related U.S. Application Data

(60) Provisional application No. 61/587,718, filed on Jan. 18, 2012.

(51) Int. Cl.
*H01Q 9/04* (2006.01)
*H01Q 1/24* (2006.01)
(Continued)

(52) U.S. Cl.
CPC ............ *H01Q 9/045* (2013.01); *H01P 1/18* (2013.01); *H01Q 1/243* (2013.01); *H01Q 21/245* (2013.01); *H03H 7/42* (2013.01)

(58) Field of Classification Search
CPC .......................... H01Q 9/045; H01Q 21/245
(Continued)

(56) References Cited

U.S. PATENT DOCUMENTS

RE29,296 E * 7/1977 Krutsinger ............ H01Q 9/0471
343/700 MS
4,242,685 A * 12/1980 Sanford ................ H01Q 13/18
343/700 MS
(Continued)

OTHER PUBLICATIONS

International Search Report dated May 1, 2013, for PCT/IL2013/050051.
(Continued)

*Primary Examiner* — Dameon E Levi
*Assistant Examiner* — Ab Salam Alkassim, Jr.
(74) *Attorney, Agent, or Firm* — Henry M. Feiereisen LLC (57) ABSTRACT

A surface antenna with a single radiation element, which comprises (a) a power source with first and second poles; (b) a phase shifting element, inserted to the path of one of the poles of the power source in such a manner that the phase shifting device shifts the phase of a first signal propagating through said pole such that the shifted phase of the first signal will be essentially identical to the phase of a second signal propagating through the other pole. The shifted first signal is added to the second signal with essentially the same phase of second signal, whenever both poles are connected together to form a single-wire, through which the resulting added signal propagates. Alternatively, the antenna may include two phase shifting elements, coupled to each of the poles of said power source in such a manner that one of the two phase shifting elements shifts the phase of a first signal propagating through the first pole while the other phase shifting element shifts the phase of a second signal propagating through the second pole such that the shifted phases of both signals will be essentially identical, and such that the shifted signals are added with essentially the same phase, whenever both poles are connected together to form a single-wire, through which the resulting added signal propagates; (c) a radiation element, in the form of a flat radiation layer that may be adapted to match a variety of surfaces, for (Continued)

receiving the added signal, wherein the added signal may be spilt into two or more wire lines with identical or different lengths.

10 Claims, 7 Drawing Sheets

(51) Int. Cl.
    *H01Q 21/24*     (2006.01)
    *H01P 1/18*     (2006.01)
    *H03H 7/42*     (2006.01)

(58) Field of Classification Search
    USPC ............ 343/850, 859, 700 MS; 333/26, 156
    See application file for complete search history.

(56) References Cited

U.S. PATENT DOCUMENTS 8,596,533 B2* 12/2013 Qu .................. G06K 19/07749
    235/440
2003/0038698 A1* 2/2003 Hirayama ............... H01F 5/003
    336/200
2004/0140936 A1* 7/2004 Morrow ................ H01Q 9/045
    343/700 MS
2008/0186237 A1* 8/2008 Tanaka .................. H01Q 9/045
    343/700 MS
2009/0315792 A1* 12/2009 Miyashita .............. H01Q 1/243
    343/742
2011/0254747 A1* 10/2011 Haridim ................. H01Q 1/243
    343/722
2011/0267062 A1* 11/2011 Otake ................ G01R 33/3685
    324/322
2012/0154248 A1* 6/2012 Haque ..................... H01Q 1/38
    343/880
2012/0169543 A1* 7/2012 Sharma ................ H01Q 9/0421
    342/458

OTHER PUBLICATIONS

Jason Ramin Saberin, "Optically Transparent Antennas for Small Satellites", Aug. 31, 2010.

* cited by examiner

31 Metal line  32 Dielectric Substrate  33 Metal Layer

SURFACE ANTENNA WITH A SINGLE RADIATION ELEMENT

FIELD OF THE INVENTION

The present invention relates to the field of Radio Frequency (RF) antennas. More particularly, the invention relates to a linear flat antenna for implementation in different communication equipment, including antenna in a window (e.g., of a car) without degradation of the window's visibility and mobile handset.

BACKGROUND OF THE INVENTION

Dipole is known for its superb usage as a linear antenna. However dipoles and also monopoles can not be implemented as an internal antenna in devices that include a Printed Circuit Board (PCB). In many communication devices, such as cellular handset, there is a grounding problem associated with the presence of the PCB acting as a ground. For example, in cellular handsets and other mobile device with RF communication capabilities the PCB does not allow using such a monopole/dipole antenna.

Moreover, antennas are commonly made of metal of high conductivity such as aluminum or copper. In order to realize a transparent antenna, one needs to use a transparent conducting material whose conductivity is much lower than that of metals. The challenge is how to produce a high performance antenna (like dipole) in spite of the conductivity of currently available transparent conducting materials. Various transparent antennas have been proposed so far such as that disclosed in a thesis submitted to the faculty of The University of Utah by J. R. Saberin, "Optically Transparent Antennas for Small Satellites", 2010. However, the proposed transparent antennas having major feeding problems which, for example, results in the reduction of emitted signal over the transparent radiation surface of such antennas (see, for example, Balanis, Antenna theory: "Analyze and Design", Wiley, New York, 1966).

It is an object of the present invention to provide a flat or flexible surface RF antenna which is high performance achieving with only one radiating element (not two elements, like in dipole or monopole which requires a ground).

It is another object of the present invention to use a transparent material with the increased resistance as an RF antenna.

It is yet another object of the present invention to overcome the feeding problems of the transparent antennas proposed in the prior art.

Other objects and advantages of the invention will become apparent as the description proceeds.

SUMMARY OF THE INVENTION

The present invention relates to a surface antenna with a single radiation element, comprising:

a) a power source having first and second poles;
b) a phase shifting element, inserted to the path of one of the poles of said power source in such a manner that said phase shifting device shifts the phase of a first signal propagating through said pole such that the shifted phase of said first signal will be essentially identical to the phase of a second signal propagating through the other pole, and such that the shifted first signal is added to the second signal with essentially the same phase of second signal, whenever both poles are connected together to form a single-wire, through which the resulting added signal propagates; or:
c) two phase shifting elements, coupled to each of the poles of said power source in such a manner that one of said two phase shifting elements shifts the phase of a first signal propagating through the first pole while the other phase shifting element shifts the phase of a second signal propagating through the second pole such that the shifted phases of both signals will be essentially identical, and such that the shifted signals are added with essentially the same phase, whenever both poles are connected together to form a single-wire, through which the resulting added signal propagates; and
d) a radiation element, in the form of a flat radiation layer that may be adapted to match a variety of surfaces, for receiving said added signal, wherein said added signal may be spilt into two or more wire lines with identical or different lengths.

According to an embodiment of the invention, the radiation element is made of conducting material that is optically transparent (in the visible spectrum). According to some embodiments of the invention, the radiation element is made of a thin layer grown on a substrate, or stuck to it (e.g., cloth), a conducting tape, or a conductive cloth. For example, the radiation element can be a conductive martial in form of a flat board or flexible surface.

According to an embodiment of the invention, the phase shifting element is an inverter that shifts the phase of its corresponding pole by 180 degrees, such that the shifted signal(s) is added to the signal of the other pole with essentially the same phase. Alternatively, each phase shifting element of the two phase shifting elements shifts the phase of its corresponding pole by +90 degrees or by −90 degrees, such that the shifted signals in both poles are added with essentially the same phase.

According to an embodiment of the invention, the phase shifting element is made of two spirals with wires lengths that are equal to half the wavelength that are connected in parallel in opposite directions, such that their fields cancel each other.

According to an embodiment of the invention, the phase shifting element is implemented by a cable longer by half the wavelength relative to the second cable without the phase-shifting.

According to an embodiment of the invention, the phase shifting element is implemented by a microstrip line circuit, using a high permittivity dielectric.

According to an embodiment of the invention, the surface antenna further comprises a balanced-to-unbalanced converting device (i.e., a balun) coupled to both poles of the power source for balancing the signals generated by said power source, such that the output of the power source is provided in a balanced manner at the corresponding output of said balun. In such configuration, the phase shifting element is embedded in one of the wires connected to one of the outputs of the balun by means of extra length with respect to the wire connected at the other output of the balun.

In another aspect, the present invention relates to a single polar source, comprising:

a) a power source having first and second poles; and
b) a phase shifting element, coupled to one of the poles of said power source in such a manner that said phase shifting device shifts the phase of a first signal propagating through said pole such that the shifted phase of said first signal will be essentially identical to the phase of a second signal propagating through the other pole, and such that the shifted first signal is added to the second signal with essentially the same phase of second signal, whenever both poles are connected together to form a single-wire, through which the resulting added signal propagates; or:

c) two phase shifting elements, coupled to each of the poles of said power source in such a manner that one of said two phase shifting elements shifts the phase of a first signal propagating through the first pole while the other phase shifting element shifts the phase of a second signal propagating through the second pole such that the shifted phases of both signals will be essentially identical, and such that the shifted signals are added with essentially the same phase, whenever both poles are connected together to form a single-wire, through which the resulting added signal propagates.

DETAILED DESCRIPTION OF THE INVENTION

Throughout this description the term "surface antenna" is used to indicate a linear antenna having a single radiating element, characterized such that the radiation element can be in the form of a flat radiation layer that may be adapted to match a variety of surfaces. This term does not imply any particular shape, construction material transparent or opaque or geometry of the radiation element, and invention is applicable to all suitable forms of radiation elements, such as flat boards, flexible surfaces, etc.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein. The terms, "for example", "e.g.", "optionally", as used herein, are intended to be used to introduce non-limiting examples.

The present invention discloses a flat or flexible surface antenna for various applications and the related design method. The proposed antenna can be used in conjunction with flexible surfaces such as wearable antennas constructed on cloths, as transparent flat antenna embedded in a window, etc. In another aspect, the present invention discloses a novel non-radiating phase shifter based on combination of spiral wires that can be used as an inverter in conjunction with the proposed surface antenna.

The antenna is a linear antenna and combines features of monopole and dipole. The antenna consists of a conducting plane, and a feeding scheme that includes delay lines for phase shifting. The antenna can be fed at single or multiple points. The multiple leads of the feed circuit are connected to the conducting plane at different points. The feeding circuit consists of a multiple of delay lines of various lengths designed so as to provide the same phase for the driving current fed into the antenna (i.e., the conducting plane) at various points.

The proposed antenna radiating part is made of conducting material. This can be a Printed Circuit Board (PCB) or Indium Tin oxide (ITO), or transparent (flexible) tapes if transparent antenna is needed.

The antenna of the present invention is based on the assumption that it would be possible to combine two wires (i.e., the electric lines running out from the first pole and the second pole of a power source) if currents would be of the same amplitudes and same phases. For example, this can be achieved by inserting a phase shifting element in one of the lines (i.e., a phase inverter). The phase shifting element shifts the phase of a first signal propagating through that line such that the shifted phase of the first signal will be essentially identical to the phase of a second signal propagating through the other line (delay line by half the wavelength or phase shifter by 180°). For instance, 0.5 nanosec delay line can be used for signal with a frequency of 1 GHz. After the phase shifting device, phases and amplitudes of the currents in both lines are essentially identical. Thus, both lines can be combined into a single wire, such that the shifted first signal is constructly added to the second signal with essentially the same phase of the second signal whenever both lines are connected together to form a single-wire, through which the resulting added signal propagates (i.e., the sum of the currents from both lines).

Alternatively, this two wires combination can be achieved also by using two phase shifting elements that are coupled to each of the poles of the power source. For example, this can be done such that one of the phase shifting element shifts the phase of a first signal propagating through the first pole (e.g., by +90 degrees) and the other phase shifting element shifts the phase of a second signal propagating through the second pole (e.g., by −90 degrees) such that the shifted phases of both signals will be essentially identical.

Figure 1:
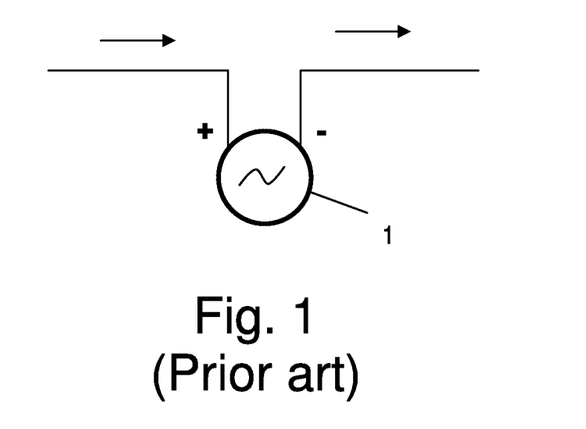
FIG. 1 schematically illustrates a typical dipole, according to the prior art.

FIG. 1 schematically illustrates a typical dipole antenna connected to a power source 1 by electric lines running out from its two poles, the first pole (as indicated by the sign "+") and the second pole (as indicated by the sign "−"). Unfortunately, such antenna is lack the ability to be implemented as an internal in some common communication equipment such as cellular handsets and other mobile devices with RF communication capabilities in which the unavoidable presence of a PCB does not allow using a monopole/dipole.

Figure 2:
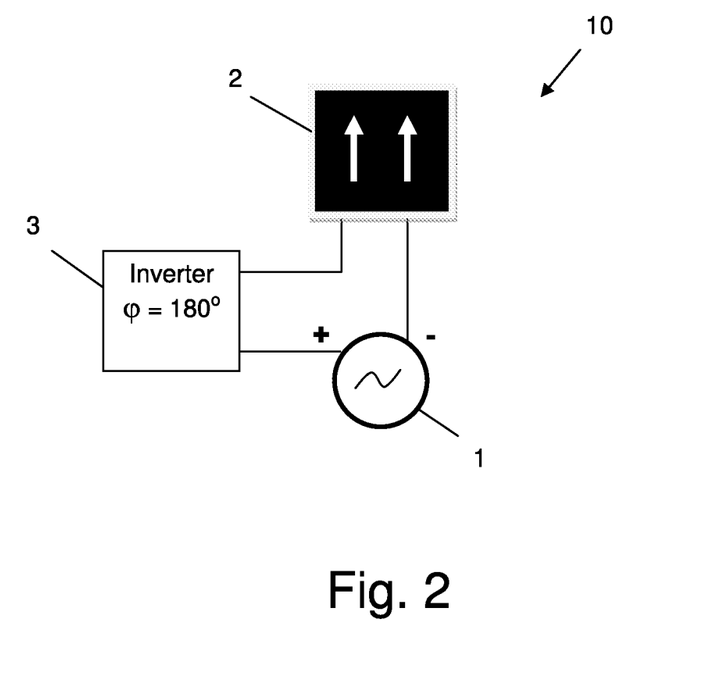
FIG. 2 schematically illustrates a flat antenna, according to an embodiment of the present invention.

FIG. 2 shows a flat antenna with a single radiating element, in accordance to an embodiment of the present invention. The antenna illustrated in this figure is particularly convenient because it can be applied to existing communication devices (e.g., cellular handset or other mobile devices) without the need to carry out major alterations in the structure. The flat antenna generally indicated by numeral 10 in the figure comprises a radiation element 2 having an essentially flat board form, a phase shifting element 3 (i.e., an inverter) and a power source 1. In this embodiment, one of the poles of source 1 is connected to the radiation element 2 through the inverter 3 (via a first electric line), while the second pole is directly connected to the radiation element 2 (via second electric line).

Figure 3:
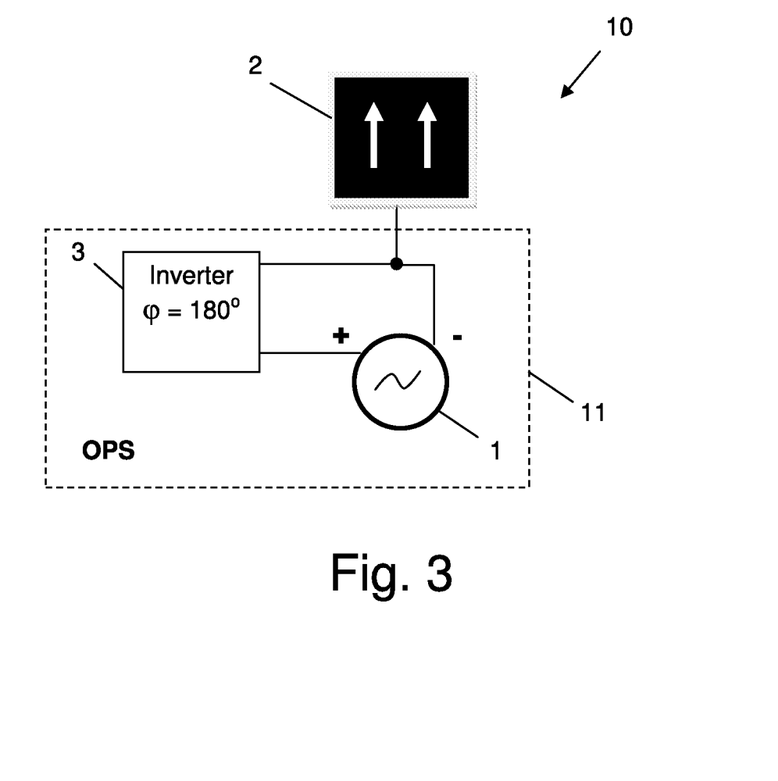
FIG. 3 schematically illustrates a flat radiation element coupled to an One Polar Source (OPS) unit, according to an embodiment of the present invention.

The phase shifting element 3 is coupled to one of the poles of the power source 1 in such a manner that the phase shifting element 3 shifts the phase of a first signal propagating through the first pole such that the shifted phase of the first signal will be essentially identical to the phase of a second signal propagating through the other pole. As both electric lines have the same potential they can be combined to a single line (as shown in FIG. 3). Their combining is such that the shifted first signal is added to the second signal with essentially the same phase of second signal, whenever both poles are connected together to form a single wire or single plane or surface, through which the resulting added signal propagates.

Throughout this description a unit, consisting of a source, an inverter and outgoing wires as shown with respect to FIG. 3 by the dotted line 11 is called One Polar Source (OPS).

Figure 4:
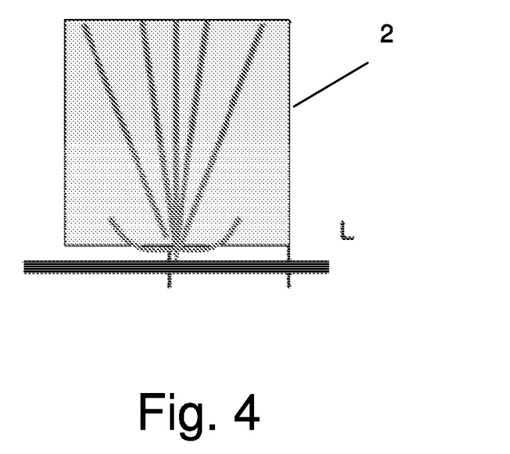
FIG. 4 schematically illustrates how the emitted signal over a flat radiation element is reduced due to fact that the currents on the radiation element are of different length.
Figure 5:
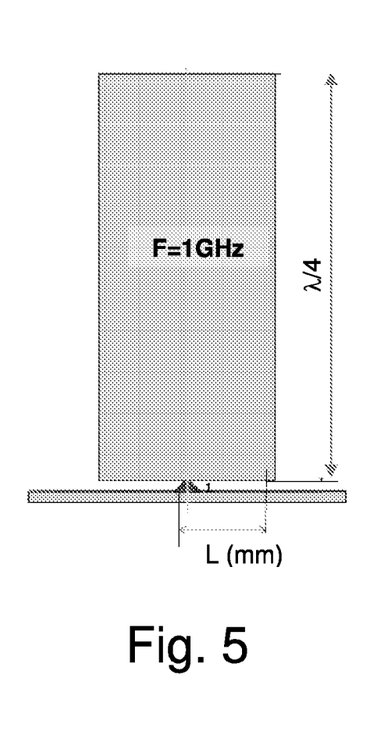
FIGS. 5 and 6 schematically illustrate a simulated board and the problematic results of the reduction of emitted signal over that board.
Figure 6:
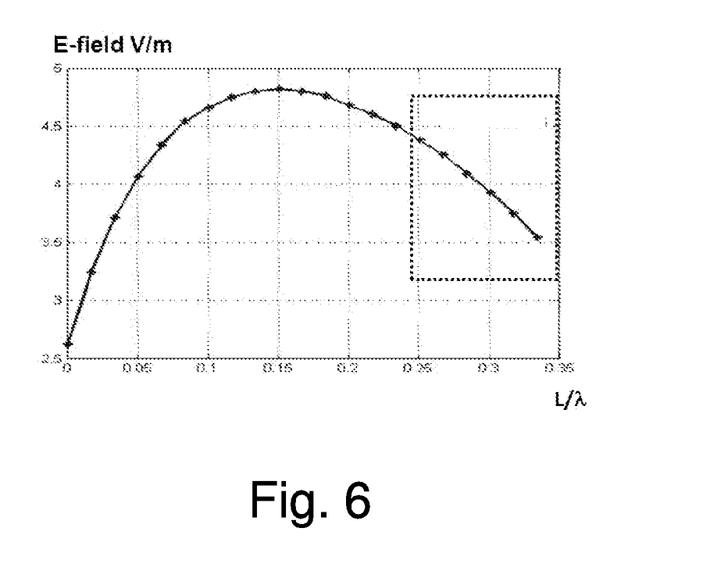

It is known that the effect of increased sheet resistivity board can compensate the increase of its width. However, the radiation element 2 (i.e., an expansion board) shown in the circuit of FIG. 4 leads to a reduction of the emitted signal. This can be explained by the fact that the currents on the board (i.e., on the radiation element 2) are of different length (as schematically demonstrated in FIG. 4). This assumption was tested by a computer program for the 3D EM simulation of high frequency components (CST Microwave Studio) with different widths of a board (see FIG. 5). The results of the simulation are shown in FIG. 6. The results show that the width of boards to be used as radiation element cannot be more than 0.25 L/λ. The problematic reduction of the emitted signal is indicated by the dotted line on the left side of the graph in FIG. 6.

Embodiments of the present invention offer a solution to the reduction of the emitted signal over a relatively wide board (which allows using much wider boards as radiation element which overrides the aforementioned 0.25 L/λ limitation). The solution involves dividing the board by several narrow sub-boards—bands (strips). According to an embodiment of the invention, on each band a signal is fed by lines of equal length. This provides the same phase of the signal supplied (see FIG. 7).

All the above will be better understood through the following illustrative and non-limitative examples.

Figure 7:
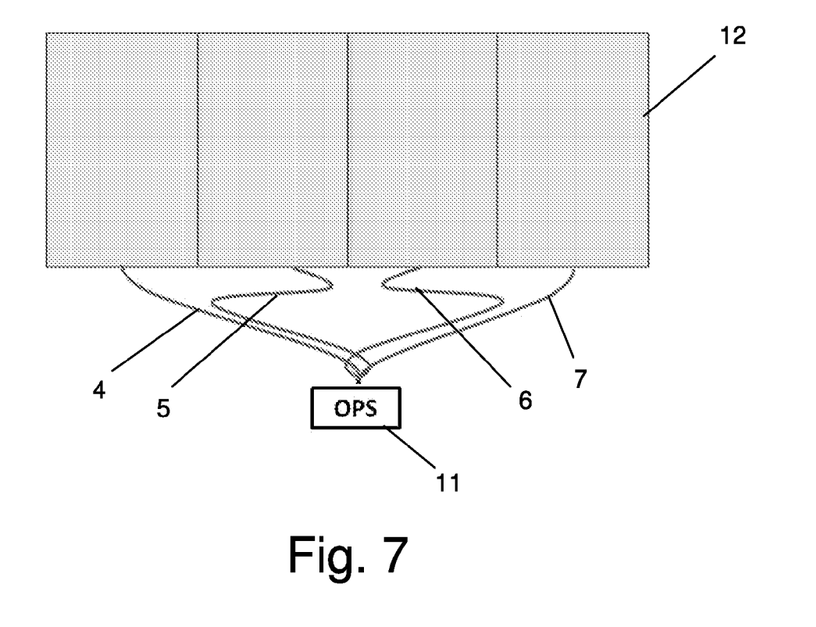
FIG. 7 schematically illustrates an exemplary flat antenna having a relatively wide board radiation element divided into four board bands (strips or sub-boards), according to an embodiment of the present invention.

FIG. 7 schematically illustrates an exemplary flat antenna having a wide board radiation element 12 divided into four board bands, according to an embodiment of the present invention. The board radiation element 12 is fed by signal supplied by the OPS 11 via several lines of equal length (e.g., as indicated by the four lines 4, 5, 6 and 7). Each one of the lines 4-7 is connected to one of the four board bands.

Figure 8:
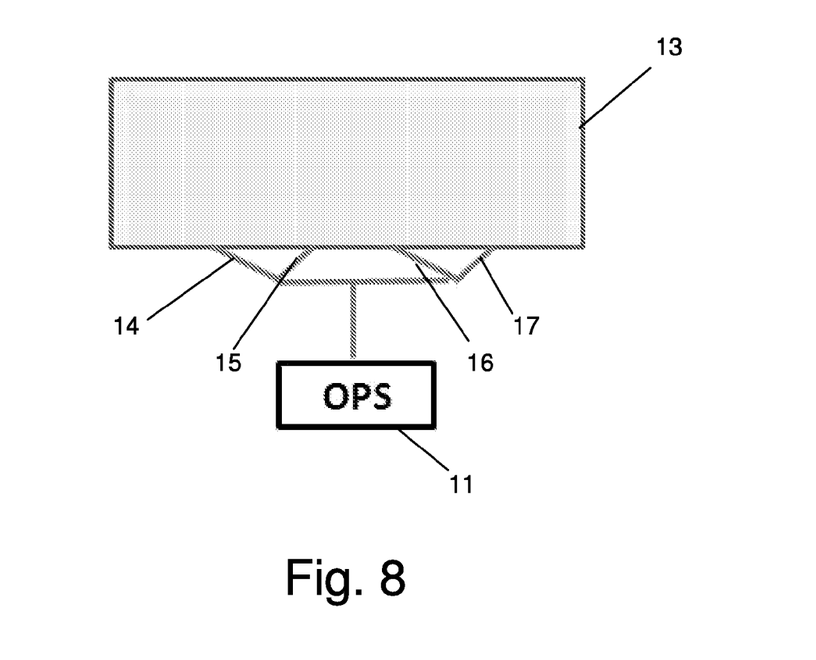
FIG. 8 schematically illustrates a transparent antenna, according to an embodiment of the present invention.

On FIG. 8 one can see a transparent antenna version of FIG. 7, according to an embodiment of the present invention. The transparent antenna includes a transparent flat radiation board (film) 13 fed by signal supplied by the OPS 11 via four lines of equal length 14, 15, 16 and 17, similar to the circuit of FIG. 7. The transparent flat radiation board 13 can be made of a conductive element such as Transparent Conducting Films (TCFs) which are optically transparent and electrically conductive.

According to an embodiment of the invention, the phase shift can be achieved by phase shifting means (e.g., an inverter) such as a delay line. For example, if a delay line is used as a phase shifting means, then its delay must correspond to half period. As aforementioned to construct the OPS 11 an inverter is needed. The inverter can be carried by cable longer by half the wavelength than the cable without the phase-shifting, for example, by using coaxial cables (see FIG. 12 for further details).

Figure 12:
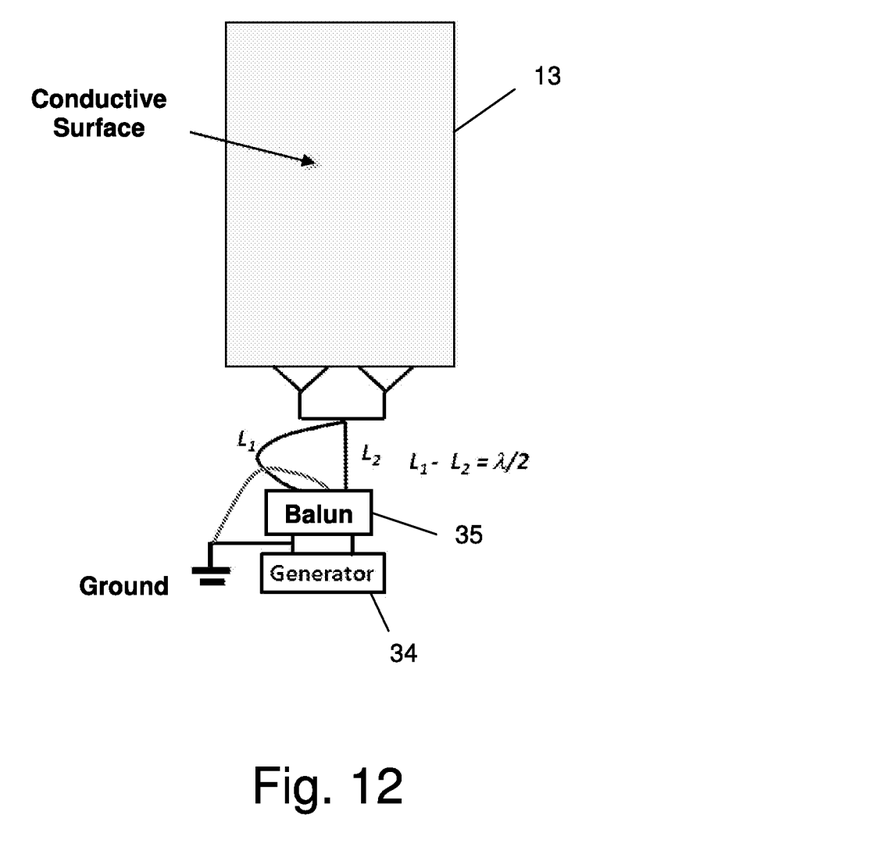
FIG. 12 schematically an exemplary implementation of a flat antenna, according to some embodiments of invention.

Referring now to FIG. 12, the radiation board 13 of the proposed antenna needs to receive a balanced output from an unbalanced power source. However, the power source for the antenna (e.g., such as generator 34) is usually unbalanced. According to an embodiment of the invention, an electrical device that converts between a balanced signal and an unbalanced signal (e.g., a balun 35) is connected at the output of the generator 34 for applying a balanced output. At the outputs of the balun 35 one can implement two wires (e.g., coaxial cables L1 and L2 as shown in FIG. 12) of difference by λ/2 in their lengths (i.e., the length of L1-L2=λ/2), such that the inverter is embedded in one of the wires by means of extra length with respect to the other wire (e.g., as shown with respect to cable L1 in the figure).

Figure 9:
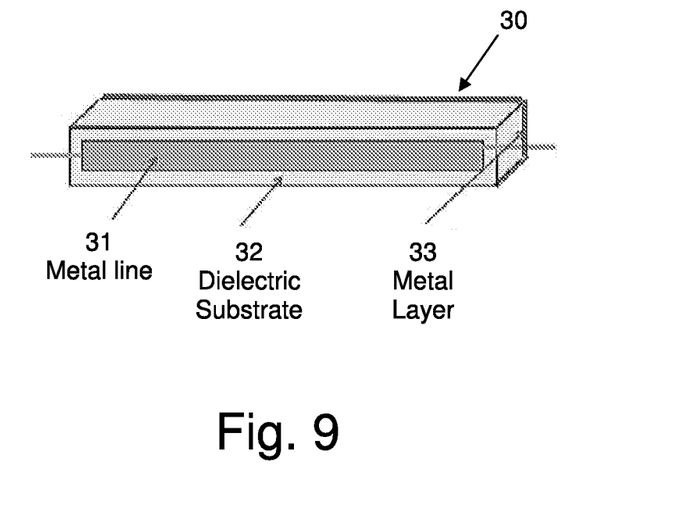
FIG. 9 schematically illustrates an inverter constructed by a microstrip line.

Alternatively, the inverter can be constructed by a modified microstrip line (i.e., conductive strips grown on a high dielectric constant substrate with no ground plane) with high-dielectric constant, the effective length of which will be half the wavelength. FIG. 9 schematically illustrates such a microstrip line 30 with high-dielectric constant compared to air permeability that comprises a metal line 31, dielectric substrate 32 and a metal layer 33.

Figure 10:
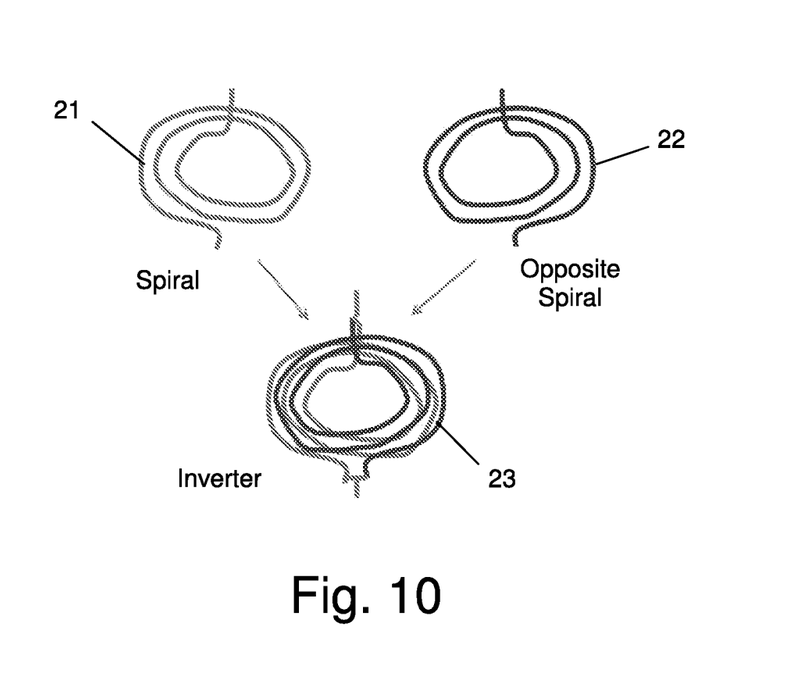
FIG. 10 schematically illustrates a novel inverter configuration by combining two spiral wires, according to an embodiment of the invention.

However, it is assumed that the use of wire or microstrip line has drawbacks associated with the emission of these devices. In fact, they may act as electric antennas. If the wire is turned into a coil or spiral, then it will be a magnetic antenna. Here a new solution is proposed to overcome such drawback According to an embodiment of the invention, a novel inverter is provided by combing two spirals with wires lengths that are equal to half the wavelength and connecting them in parallel in opposite directions, such that their fields will be compensated. FIG. 10 schematically illustrates two spiral wires: a spiral 21 and a corresponding opposite spiral 22 that are combined together to form an inverter 23 such that their magnetic fields (if it interferes) will be compensated, resulting in zero radiation.

Figure 11:
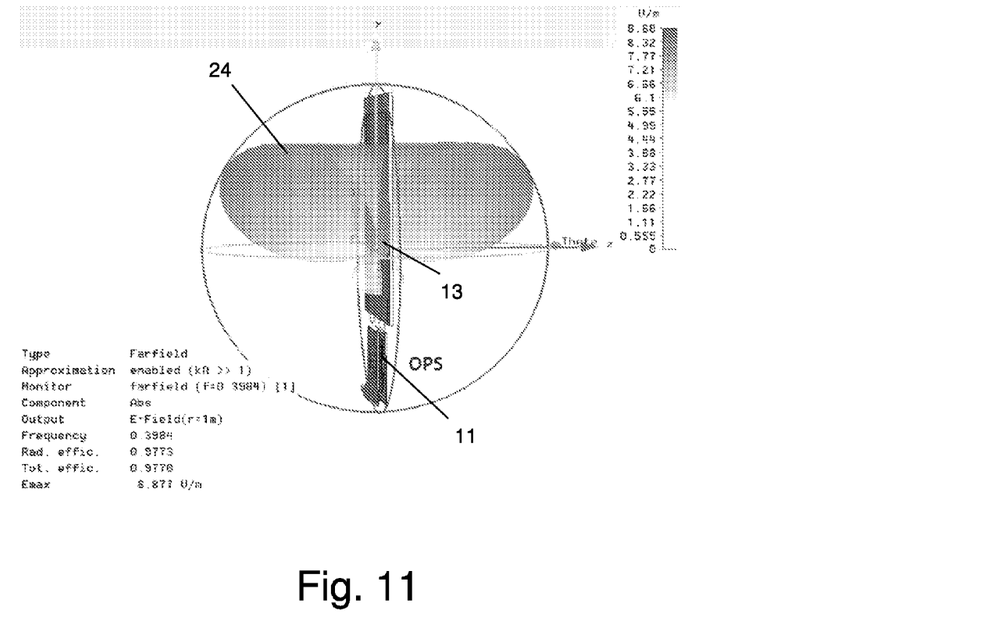
FIG. 11 shows simulation results of the transparent antenna of FIG. 8 while using the an OPS with the novel inverter of FIG. 10.

One can see on FIG. 11 simulations result of a transparent antenna, corresponding to the transparent radiation board 13 of FIG. 8 and the OPS 11 provided with an inverter such as the inverter 23 described hereinabove with respect to FIG. 10. The emitted radiation is indicated by numeral 24 in the figure.

As will be appreciated by the skilled person, the arrangement described in the figures results in a flat or flexible surface RF antenna with a single radiating element. This eliminates the need to have two elements, like in dipole which requires two arms, or monopole which requires one arm and a ground. This goal is achieved by using the inverter as described with respect to the aforementioned embodiments.

All the above description and examples have been given for the purpose of illustration and are not intended to limit the invention in any way. Many different mechanisms, methods of analysis, electronic and logical elements can be employed, all without exceeding the scope of the invention.

The invention claimed is:

1. A surface antenna with a single radiation element, consisting of:
   a power source having first and second poles;
   a device selected from the group consisting of a first device and a second device,
   wherein the first device includes a phase shifting element, inserted to the path of one of the poles of said power source in such a manner that said phase shifting device shifts the phase of a first signal propagating through said pole such that the shifted phase of said first signal will be essentially identical to the phase of a second signal propagating through the other pole, and such that the shifted first signal is added to the second signal with essentially the same phase of second signal, and both poles are connected together to form a single-wire, through which the resulting added signal propagates, and
   wherein the second device includes two phase shifting elements, coupled to each of the poles of said power source in such a manner that one of said two phase shifting elements shifts the phase of a first signal propagating through the first pole while the other phase shifting element shifts the phase of a second signal propagating through the second pole such that the shifted phases of both signals will be essentially identical, and such that the shifted signals are added with essentially the same phase, and both poles are connected together to form a single-wire, through which the resulting added signal propagates; and
   a single radiation element, in the form of a single flat radiation layer that may be adapted to match a variety of surfaces, for receiving said added signal, wherein said added signal is split into several wire lines,
   wherein said several wire lines include at least three wire lines connected to the board radiating element formed as the single flat radiating layer in at least three points spaced from one another in a direction transverse to said wire lines and distributed along the radiating element in said direction, with at least one of said points being spaced from end edges of the radiating element formed as the single flat radiating layer as considered in said direction, and all said wire lines have a wavy configuration and a same length.

2. An antenna according to claim 1, in which the radiation element is made of conducting material.

3. An antenna according to claim 1, in which the phase shifting element is an inverter that shifts the phase of its corresponding pole by 180 degrees, such that the shifted signal(s) is added with essentially the same phase.

4. An antenna according to claim 1, in which each phase shifting element of the two phase shifting elements shifts the phase of its corresponding pole by +90 degrees or by −90 degrees, such that the shifted signals in both poles are added with essentially the same phase.

5. An antenna according to claim 1, in which the phase shifting element is made of two spirals with wires lengths that are equal to half the wavelength and connecting them in parallel in opposite directions, such that their fields will be compensated.

6. An antenna according to claim 1, in which the phase shifting element is implemented by cable longer by half the wavelength than the cable without the phase-shifting.

7. An antenna according to claim 1, in which the phase shifting element is implemented by a strip line circuit, using a dielectric with high-dielectric constant compared to air permeability.

8. An antenna according to claim 1, further comprises a balanced-to-unbalanced converting (Balun) device coupled to both poles of the power source for balancing the signals generated by said power source.

9. An antenna according to claim 1, in which the radiation element is made of a thin layer grown on a substrate, or stuck to it.

10. An antenna according to claim 1, in which the radiation element is selected from the group consisting of a flat board, a flexible surface, a conducting tape or a conductive cloth.

* * * * *